United States Patent [19]

Stein

[11] Patent Number: 5,283,154
[45] Date of Patent: Feb. 1, 1994

[54] RANDOM SCREEN WATERLESS PRINTING PROCESS

[75] Inventor: Richard E. Stein, Denver, Colo.

[73] Assignee: National Printing and Packaging Company, Denver, Colo.

[21] Appl. No.: 861,226

[22] Filed: Apr. 1, 1992

Related U.S. Application Data

[63] Continuation-in-part of Ser. No. 602,676, Oct. 24, 1990, abandoned.

[51] Int. Cl.$^5$ ............................................. G03F 7/00
[52] U.S. Cl. .................................. 430/301; 430/303; 101/456; 101/467; 101/450.1; 101/469
[58] Field of Search ............... 430/301, 303; 101/456, 101/467, 450.1, 469

[56] References Cited

U.S. PATENT DOCUMENTS 4,037,533 7/1977 Rapoport et al. .................. 430/301
4,259,905 4/1981 Abiko et al. ......................... 101/467

*Primary Examiner*—John Kight, III
*Assistant Examiner*—John M. Cooney, Jr.
*Attorney, Agent, or Firm*—Beaton & Swanson

[57] ABSTRACT

An improved method of making lithographic reproductions is disclosed. The method involves several improvements over prior processes, including (a) the combination of random plates and a waterless, dry press for halftone, duotone, tritone and four color separation halftone printing, and (b) the use, in duotone, tritone and four color separation halftone printing of random plates exclusively for all the plates involved in the multi-step printing process.

10 Claims, No Drawings

RANDOM SCREEN WATERLESS PRINTING PROCESS

This is a continuation-in-part of copending application Ser. No. 07/602,676 filed on Oct. 24, 1990, now abandoned.

BACKGROUND OF THE INVENTION

This invention pertains to the photolithographic reproduction of original copy, and more particularly to processes including (a) the new combination of a halftone, random screen printing method and a waterless printing press, and also including (b) an improved method of enhanced halftone printing using random screens for all plates.

The photolithographic reproduction process of this invention is an improvement in offset printing. To better understand the invention, the following description will first discuss the offset printing of original copy using printing plates formed from conventional halftone grid screens and using conventional water and ink emulsion press processes for effecting the printing steps. The description will then discuss typical variations to conventional offset printing, including the use of random pattern screens to replace one or more of the conventional halftone grid screens in forming the printing plates, and including the use of waterless press processes to replace the water and ink emulsions of conventional printing presses in effecting the printing steps.

Conventional printing of original copy involves the use of a printing plate which contains an image of the original copy to be reproduced. The original copy may be line art or continuous tone art, and may, in either case, be single colored (monochrome) or multi-colored.

Monochrome line art, which includes most typography, is original copy having only a base color of constant tone value applied over a substrate. The substrate may be paper, but can also include any suitable surface of natural or synthetic material, such as metal, fabric, wood or plastics, including polystyrene, polyester, polypropylene and sheet vinyl. The base color of constant tone value is referred to as a monotone. Because of the characteristic monotone which appears over the substrate, line art itself may be referred to generally as monotone.

Monochrome continuous tone art, which includes single-color photographs, is original copy having a single base color and also having gradations of tone value in that base color applied over a substrate. The gradations of tone value may be referred to as shades occupying a scale of more or less continuous tones from light to dark in the range between clear, or no color value, and full, or complete color value. Any individual shade is referred to as a halftone of the color involved, and the color itself is also sometimes loosely referred to as a halftone. Where the color involved is black, its gradations are shades of gray, the shades of gray are halftones between white (clear) and black (full), and the scale of tone values comprising all of the halftones may be encompassed on a Grey Scale in common use. By common usage, halftones of colors other than black are still referred to as "gray" tones of the non-black color. Because of the characteristic halftone or halftone range in the base color which appears over the substrate, continuous tone art itself may be referred to generally as halftone.

Both line art reproductions and continuous tone art reproductions may be multi-colored, by the superimposition of additional monotone colors over the substrate in the case of multi-colored line art, and by the superimposition of additional halftone colors over the substrate in the case of multi-colored continuous tone art. Because both line art and continuous tone art may, therefore, be single-colored or multicolored, it should be understood that the two styles are not distinguished from one another by the number of colors rendered, but by the presence or absence of graduated tone values in the colors, whether one color or many. As used in this application, "monotone" and "halftone" will always refer to line art and continuous tone art, respectively, distinguishing them by the characteristic presence or absence of graduated tone values in the original copy. As used in this application, "monochrome" and "multicolor" will refer to single color and more than a single color, respectively, applied over a substrate, and either term may pertain to monotone or halftone originals. Other terms that will be introduced later in this application, such such as duotone, tritone, and the like, will have their own meanings as set forth in the context in which the terms are introduced.

Lithographic reproduction of original line art or continuous tone art involves a smooth, flat printing plate. The printing plate containing the image of the original copy to be reproduced is fixed to a cylinder. When the cylinder runs in a typical ink and water emulsion printing press, the rotating plate is wetted so that water adheres to the plate in the non-imaged areas, and then inked with an oil-based ink so that the ink adheres to the plate only in the imaged areas. Because oil and water do not mix, this differentiates the imaged areas from the non-imaged areas. In letterpress and other direct printing processes, the printing plate works directly on a substrate which passes beneath the plate. In offset and other indirect printing processes, the printing plate does not contact the substrate directly, but rather works through a blanket. The blanket is a mat of suitable material, rubber for example, fixed to a cylinder which picks up the inked image from the printing plate and which, in turn, transfer the inked image to the substrate.

In photolithographic printing, the image of the original copy is transferred to the printing plate by photographic processes. Typical steps include forming a photographic transparency of the original copy, exposing a photosensitive plate to the photographic transparency, and then developing the photosensitive plate. The photosensitive plate, when developed, is used as the printing plate. By well known techniques and combinations of process camera work and contact exposures, it is possible to create photographic positive or negative, right-reading or wrong-reading copy (wrong-reading copy is related to right-reading copy as a mirror image is to an original image) in order to form appropriately oriented printing plates.

By way of example, and to illustrate one method of forming and using a "negative working" offset printing plate: (i) a photographic negative right-reading transparency of the original image, when exposed to a photosensitive plate, transfers its opposite, (ii) a photographic positive right-reading image of the original copy, to the printing plate, which in turn transfers, (iii) a positive wrong-reading image to the blanket, which reproduces the desired result, (iv) a positive right-reading image, on the substrate. While it is common in offset printing to use negative working plates, so called because they are formed from photographic negatives, it is also possible, using well known methods, to use positive working plates formed from photographic positive transparencies.

Where the original copy is monotone, there is no need for generating a scaled range of intermediate tone values on the printing plate to achieve adequate reproductions of the original. But where the original copy is continuous tone, a means has been devised, using halftone screens, to generate halftones on the printing plates. Halftone printing plates are typically produced by exposing a previously screened transparency of the original copy to the plate. The conventional halftone screen has a regular grid pattern defined by intersecting lines. These halftone screens typically are formed from a clear glass plate engraved with lines that are filled with ink or another opaque substance. The halftone screen may be the glass plate itself or may be a photographic transparency of the glass plate, or it may be electronically generated by a scanner. In either case, the conventional halftone screen is a partially transparent grid containing a number of transparent square or ellipitical "dots" bounded by opaque intersecting lines.

A conventional halftone screen has the ability to resolve an image seen through it into a number of dots determined by the number of regularly spaced opaque lines per inch of the screen. A 50 line screen, for example, contains 50 lines per inch in both dimensions and resolves an image into 2,500 dots per square inch ("dpi"). Similarly, a 300 line screen resolves to 90,000 dpi. Coarser screens, having 55 to 100 lines, are easier to make and use than finer screens, having between 150 to 300 lines.

The halftone screen breaks the photographic negative or positive image of the original copy into dots. At the high resolutions obtained by a halftone screen, individual dots are so small that they are almost invisible to the human eye. Combinations of these individual dots, when inked in any single color, can comprise a larger pattern of monochrome dots. Varying only in size and shape, but not in color, various patterns of monochrome dots can nevertheless create the impression of a continuous scale of graduated color tones ranging from light to dark according to the density of the tone they are to reproduce. In reproducing light tones of the original continuous tone copy, sparse combinations of individual dots widely separated from one another produce a light effect. Darker tones of the original are reproduced by increasingly dense dot combinations in which many individual dots join so closely together as to create an almost completely opaque region. A halftone effect is, accordingly, created by breaking the continuous tone original into dots on the printing plate. The halftone method effects an analog to digital (binary) conversion, so that, applying a single color ink to the halftone plate, simply inking or not inking each individual dot creates the effect of a continuous tone copy in the reproduction.

Single color continuous tone art may be reproduced in a single step by a single halftone printing plate. Multicolored continuous tone art involves several halftone printing plates overprinted on a substrate in sequence and in registry. The full color spectrum can be approximated by overprinting three or four halftone plates, one for each of three traditional printing process colors, cyan, magenta and yellow, and, preferably, a fourth halftone plate for black. Because printing is subtractive, these process colors reproduce the effect of the natural, additive, primary colors, red, green and blue. Considering each overprint to be a separate step, basic multi-colored printing can be considered to be multi-step printing, involving three or four steps depending on whether three of four halftone plates are used.

The halftone plates used for color work are formed by the use of color filters to create color photographic separations of the original, or are generated on a scanner which produces the same effect electronically as can be produced by the photomechanical process. From the original copy, which might be a multicolored photograph or a painting, a separate continuous tone color separation is made for each of the colors cyan, magenta, yellow and black. A continuous tone color separation is made by exposing the original copy to a photographic film surface through a filter that eliminates all light but that of the desired color. The filter which does so is the color complement of the desired color. A cyan color separation is made with a red-orange filter (which absorbs colors other than cyan, leaving a single colored continuous tone photographic image in cyan); a magenta separation is made with a green filter; a yellow separation is made with a blue-violet filter; and a black separation is made with a combination of filters. Except in the case of a scanner in which the images are electronically prescreened, each of the four photographic images so produced is a single colored continuous tone image. From each of these four single-color continuous tone images, a halftone printing plate is formed using halftone screens in the same manner as for the Grey Scale halftone printing plate previously described. Each of the four halftone printing plates is inked with the appropriate single color ink (cyan, magenta, yellow and black), and each plate reproduces the corresponding single color halftone image. When the four plates are overprinted in sequence and in registry, the combination of halftone process colors and black reproduces a single multicolored continuous tone image with a more or less high degree of tonal fidelity to the original copy over the full color spectrum.

Multi-step printing, involving the overprinting of separate halftone plates in sequence and registry, may be used not only to reproduce multi-color original copy as described, but also to produce enhanced monochrome continuous tone reproductions. Further, additional overprinting of multi-color original copy can be done to produce enhanced multi-color continuous tone reproductions. Before discussing enhanced monochrome or enhanced multi-color printing, a number of terms for expressing the quality of a halftone reproduction will be introduced. Those terms are density, transparency, and contrast, and they will be discussed below.

The density of a gray tone expresses the lightness or darkness of the halftone. Density is commonly expressed as a numerical reading on a commercially available Grey Scale such as one distributed by the MacBeth Company, Division of Killmorgen Corporation, P.O. Box 950, Newburgh, N.Y. 12550. A Grey Scale reading of 0 is a clear transparency representing white, or an absence of any gray tone; a reading of 3.0 is completely opaque and represents black, or a full gray tone; intermediate values for lighter or darker shades of gray fall between zero and three. Printed materials, including prints of the Grey Scale itself, are limited in their range of gray tones. The printed MacBeth Grey Scale extends from 0.05 to 2.1. Density is measured by transmission or reflection densitometers, automatic photoelectronic instruments that are adapted to measuring the density of either transparent copy or opaque copy, respectively.

Such readings are accepted as standards for evaluating the quality of printed reproductions.

The transparency, or transparency factor, of a continuous tone image is the average density of the image measured on the Grey Scale by a densitometer. The contrast, or contrast factor, of a continuous tone image is the range of gray tones, measured as the difference between the highest and lowest densities found within the image. The transparency factor expresses the average overall lightness or darkness of an image; the higher the number, the darker the material appears. The contrast factor expresses the range of shading within an image. Higher contrast would indicate a wide range of density values, marked by the presence of relatively light areas and relatively dark areas in the same image (e.g., an image having a highest density of 2.0 and a lowest density of 0.1 would have a contrast factor of 1.9, which is relatively high). Lower contrast would indicate a smaller range of density (e.g., an image having a highest density of 2.0 and a lowest density of 1.8 would have a contrast factor of 0.2, which is relatively low). The specification of both the factor and the contrast factor for a continuous tone image is an accurate measure of its appearance and would permit one skilled in the art to reproduce the image, and to measure the quality of the resulting reproduction.

Enhanced monochrome halftone printing of continuous tone original copy is typically done by use of two halftone printing plates to improve the reproduction of higher density areas of the original copy. Because of limitations in inking the darker areas of a halftone printing plate, it is common for a single halftone plate to reproduce grays in the range only from 0.05 to 1.5. While it is thus possible to make very good reproductions of the light and intermediate range of grays below 1.5 in density from a single halftone plate, the darkest grays, ranging from 1.5 to 2.1 are typically reproduced as uniform 1.5 values and the detail of the original copy is lost (the contrast factor of the reproduction will be lower than that of an original copy having high contrast and a highest density greater than 1.5).

Enhanced monochrome halftone printing involves the overprinting of one halftone printing plate with a second halftone printing plate to enhance the dark gray detail reproduced. Each of the two printing plates is formed from the same photographic image of the original, but the second photographic image is washed or lightened relative to the first by, for example, overexposing the second film relative to the first, thereby washing out from the second image the lower range of density values while retaining, to some degree, the higher and darker densities of the image. When the second printing plate formed from the overexposed image overprints the first plate made from the normally exposed image, the final reproduction contains light and intermediate tones produced by the first plate and unaffected by the second plate, but also contains more detail in the darker tone areas by addition of tone values from the second plate. The second plate might also be washed relative to the first by means of differing optical properties of the screen from which the second plate is made, so as to produce the same effect without the need for two different exposures. By means of the enhanced multi-step process, the highest density values in the reproduction can typically be extended from the 1.5 upper limit commonly encountered in single step printing to 1.7 or 1.8, resulting in significantly enhanced dark shadow quality in the reproduction of originals having high transparency factors or having high contrast factors.

Enhanced multi-color halftone work is done by extending those methods to multi-color original copy. Where four halftone color separations are used (cyan, magenta, yellow and black), any one or more of the colors may be enhanced by overprinting with an additional plate, washed relative to the first. While it is not common to do enhanced multi-color halftone work, it is typically accomplished with six plates, wherein it is the cyan and magenta separations that are enhanced with a second plate for each, and it is also possible to use from five to eight plates, wherein any of one to all four of the color separations is enhanced.

All of the foregoing is included in only so much detail as is helpful to understanding the method of the present invention. Limitations in reproducing original copy by conventional offset halftone printing methods such as those described above are inherent in the processes described and have been the subject of physical and chemical improvements.

To better understand the method of the present invention, we have already defined halftone as signifying continous tone art having gradations of tone. Other terms are as follows:

1. Halftone. Refers to a single color over a substrate where the color over the substrate has halftone gradations. In reproducing a basic halftone, the halftone color is printed with a single plate and a single color.

2. Duotone. Refers to two colors overprinted in sequence and in registry over a substrate where the two colors may be (a) the same, or (b) different from each other.

(a) Enhanced monochrome halftone (duotone). Refers to the same two colors printed over a substrate where both of the two colors have halftone gradations. This is referred to as "black on black," or single color duotone, since the two colors are the same. There are a total of two halftone plates used to print an enhanced monochrome so as to bring out higher tone densities, as described above.

(b) Duochrome halftone (duotone). Refers to two different colors over a substrate where both of the two colors have halftone gradations. This is referred to as "black on blue," or two color duotone, since the two colors are different. There are a total of two halftone plates used to print a duochrome.

3. Tritone. Refers to three colors overprinted in sequence and in registry over a substrate where the three colors may be (a) all the same, (b) two the same and one different, or (c) all different.

(a) Enhanced monochrome halftone (tritone). Refers to the same three colors printed over a substrate so as to bring out higher tone densities. Each of the three colors has halftone gradations. There are a total of three halftone plates used to print an enhanced monochrome of this type.

(b) Enhanced duochrome halftone (tritone). Refers to three colors over a substrate where two of the colors are the same ("black on black") so as to bring out higher tone densities, and the third color is different so as to add a different tone. All of the colors have halftone gradations. There are a total of three halftone plates used to print an enhanced duochrome.

(c) Trichrome halftone (tritone). Refers to three colors over a substrate where each of the three colors is different. All of the colors have halftone gradations.

There are a total of three halftone plates used to print a trichrome.

4. Four color separation halftone. Refers to four colors overprinted in sequence and in registry over a substrate where three of the colors are the primary process colors, cyan, magenta and yellow, and the fourth color is black.

(a) Basic four color separation halftone. Each of the four halftone colors is printed with a single halftone plate, there being 4 plates to print multicolored reproductions.

(b) Enhanced four color separation halftone (color separation with bump colors). At least one of the halftone colors is overprinted with a second plate in sequence and in registry so as to bring out the higher tone densities of at least one of the colors, there being a total of five, six, seven or eight halftone plates to print enhanced multicolored reproductions.

A problem arises when two or more conventional halftone printing plates are overprinted in registry, as in the case of four color separation halftone printing and in the case of duotone and tritone printing. When the conventional, regular geometric, halftone plates are overprinted, a moire effect, constituting an undesirable independent pattern occurs. Certain physical improvements aimed at lessening the moire effect are well known in the art. For example, color separations are typically made from four halftone screens that are angled, conventionally at 45°, 75°, 90°, and 105°. Another way to avoid moire effects is to use a non-conventional halftone screen in forming the halftone printing plates. In addition to the conventional halftone screens constituting regular geometric grids formed by intersecting lines, as described in U.S. Pat. No. 2,292,313 by Yule, there are examples of random pattern, stipple, granular and other irregularly surfaced or textured screens in U.S. Pat. Nos. 1,945,865 by Pearson; 1,710,303 by Ewald; 2,082,475 by Zoller; 2,130,735 by Eckardt; and 1,161,824 by Morris.

Additional physical improvements can be made by overprinting a conventional halftone printing plate with a random patterned halftone printing plate or solid printing plate to produce an enhanced monochrome or an enhanced multi-color reproduction. Disclosure of a two step printing process using one conventional halftone screen and a second random pattern halftone screen to form two printing plates overprinted to reproduce enhanced monochrome continuous tone original copy is in U.S. Pat. Nos. 3,581,660 (a random, irregular, granular surface pattern for the second plate) and 4,011,085 (randomly disposed irregularly shaped highlight areas and contrasting areas of different tonal values for the second plate), both by Rapoport et al., and both of which are hereby incorporated by reference. Disclosure of a multi-step printing process, using four conventional halftone screens (one for each of the three primary colors, and one more for black) angled in the conventional way, and two random pattern halftone screens (to enhance any two of the color separations) to form six printing plates overprinted to reproduce enhanced multi-colored continuous tone original copy is in U.S. Pat. No. 4,037,533 by Rapoport et al., which is hereby incorporated by reference. Other examples of lithographic printing processes including two step printing methods are in U.S. Pat. Nos. 547,780 by Gast; 871,234 by McIntosh; 809,157 by Weyl; and 3,130,669 by Cooke.

Another problem arises when using printing plates formed from higher resolution conventional screen grids having 150 to 300 lines per inch (and 22,500 to 90,000 dots per inch) or random pattern screens having between 22,500 to 62,500 or more irregularities per inch. As an ink and water emulsion works on the press, so as to wet the non-imaged areas of the printing plate and to ink the imaged areas, there is a tendency for dots on the plate to plug with ink resulting in "dot gain." As dot gain is combated by the addition of water, there is a tendency for the dots on the plate to lose too much ink and to "wash." The problems of dot gain and washing are the major difficulties in conventional water emulsion printing. There are additional problems in maintaining a proper ink to water balance.

Certain improvements aimed at enhancing the chemical properties of the offset printing process are well known. Among those improvements is the waterless press disclosed in U.S. Pat. No. 4,259,905 by Abiko et al. Conventional offset printing involves the wetting and inking of a printing plate with the ink adhering to the imaged area only. The waterless press dispenses with the ink and water emulsion altogether, by use of the ink repelling properties of silicon, for example. In a typical waterless press, the printing plate will contain a silicon positive or negative image of the original copy. The silicon coated plate may be inked without the necessity of wetting the plate to keep the ink away from the clear areas of the image. A waterless press is described in the Abiko patent previously referenced, and that patent is hereby incorporated by reference.

The combined random pattern and conventional screen processes typified by the Rapoport patents previously referenced, and the waterless press processes typified by the Abiko patent previously referenced, represent different approaches to the improvement of printing results. The Rapoport methods disclose a desirable increase in clarity, improving shadow detail, dimension and depth, as well as increasing the tone range of monochrome and multi-color reproductions, all within the capability of existing ink and water emulsion based presses. Accordingly, the Rapoport methods permit higher reproduction quality with relatively modest capital and other costs.

In contrast, the waterless press methods achieve a desirable increase in clarity, resolution, color accuracy and intensity by requiring an investment in new equipment. That equipment, once purchased, does away with the emulsions common in existing presses. By eliminating the emulsions, the waterless press operates without the problem of plugging the halftone grids at high color saturation levels. A waterless press can, accordingly, print on plates produced by the highest resolution conventional halftone grid screens without the dot plugging that had both limited the quality of reproductions made from existing presses and served as an incentive to the experimentation with irregular screens and to the development of such physical improvements to the existing press processes as are represented by the Rapoport methods.

According to the terminology used to describe this invention, the random pattern screen used in making random pattern images is a photographic transparency (film), or printing plate having a large plurality of irregularly shaped areas per square inch disposed therein in a photographic pattern. Preferably, the random pattern screen includes at least 22,500 irregularly shaped areas per square inch of screen surface and can have as many as 250,000 irregular areas per square inch. Typically, from about 40,000 to about 100,000 irregularly shaped areas per square inch are present on the random pattern screen. See Rapoport U.S. Pat. No. 4,037,533, previously incorporated herein by reference, at column 3, lines 17 through 27 (it being understood that a random pattern screen having a large plurality of irregularities can be produced electronically as well as photographically).

According to the terminology used to describe this invention, halftone and basic four color separation halftone printing using random screens and an ink and water press are disclosed in several of the patents referenced above; enhanced monochrome halftone (duotone) printing using an ink and water press is disclosed in Rapoport U.S. Pat. No. 4,011,085 and in the two-step disclosures in the other patents previously named; and enhanced four color separation halftone printing using an ink and water press is disclosed in Rapoport U.S. Pat. No. 4,037,533.

None of the existing methods described in the patents recited above or elsewhere combine halftone, duotone, tritone and four color separation halftone printing using random screens with a waterless press. Further, none of the existing methods described in the patents recited above or elsewhere contain the improvement to duotone, tritone and four color separation halftone printing which comprises the use of random screens for all plates involved in multi-step printing.

The method of the present invention includes improvements of two kinds to the multi-step Rapoport processes. One of the improvements of this invention comprises the replacement of all conventional grid screens, including the so-called master or primary screens, used in the process by random pattern screens so as to produce halftone printing plates that overprint without any regular pattern at all. This improvement creates a startlingly higher degree of resolution than previously obtained, especially when using positive working plates. Another of the improvements of this invention comprises the ability to dispense with a plurality of plates, while still achieving high quality art reproductions (that is, under the method of the present invention, a halftone has substantially the same quality as that previously attained by enhanced monochrome duotones or tritones; a duochrome duotone has substantially the same quality as that previously attained by enhanced duochrome tritones; and a basic four color separation halftone has substantially the same quality as that previously attained by enhanced four color separation halftones). This improvement permits a reproduction quality substantially as good as, and in some cases better than, the results that otherwise can be attained, and a greater efficiency and cost savings at the same time, due to the reduction in the number of plates and screens.

The improvements of this invention comprise a combination of a waterless press and random screens to accomplish halftone, duotone, tritone and four color separation halftone printing, providing a substantial and unexpected improvement to the accuracy, color depth and dimensional perception of reproductions formed by the process of this invention relative to reproductions otherwise produced.

SUMMARY OF THE INVENTION

The present invention is a method of reproducing halftone copy from continuous tone original art by using the new combination of a halftone, random screen printing method and a waterless printing press, and also including an improved method of enhanced halftone printing using random screens for all plates.

The use of separate random pattern screens to form the printing plates in the improved method of enhanced halftone printing of this invention eliminates entirely the conventional halftone screens that have been used in existing enhanced halftone printing processes, thereby improving the quality of the reproductions produced. The new combination of a waterless press with the halftone, random screen printing of this invention permits a more complete inking of a printing plate than is possible in an ink and water emulsion press and results in a substantial and unexpected improvement in the accuracy, color depth, smoothness and dimensional perception of reproductions formed by the process of this invention.

DETAILED DESCRIPTION OF THE PREFERRED EMBODIMENTS

The preferred embodiments are described in the following examples. The first set describes the enhanced printing methods and consists of examples 1(a), (b) and (c), which describe the methods of enhanced monochrome (duotone and tritone), enhanced duochrome (tritone), and enhanced four color separation halftone printing, respectively. The second set describes the basic printing methods and consists of examples 2(a), (b) and (c), which describe the methods of halftone, duotone duochrome and tritone trichrome, and basic four color halftone printing, respectively.

Example 1(a)

Enhanced monochrome halftone printing (duotone and tritone)

The improved method of the present invention is realized in the following manipulative steps for enhancing the reproduction of monochrome continuous tone original copy:

1. producing a photographic image of the original copy,
2. using the photographic image of the original copy to form a first random pattern halftone image of the original copy by photomechanical or electronic means,
3. converting the first random pattern halftone image of the original copy into a first random pattern halftone printing plate by utilizing accepted and well known procedures in the lithographic art,
4. using the photographic image of the original copy to form one second random pattern halftone image of the original copy for duotones, and two second random pattern halftone images of the original copy for tritones, by photomechanical or electronic means,
5. converting the second random pattern halftone image(s) of the original copy into second random pattern halftone printing plate(s), and
6. printing a substrate with the first and second random pattern halftone printing plates in sequence and in registry to produce a single enhanced monochrome reproduction of the original copy.

The first and second random pattern halftone images suitable for conversion into first and second random pattern printing plates may be produced from an image of the original copy by photomechanical or electronic means. In accordance with a specific aspect of the method of this invention, the first and second random pattern halftone images are different because each is produced from a different random pattern.

These steps may be accomplished photomechanically by exposing the photographic image of the original copy to a photosensitive surface through a first random pattern screen. The first random pattern screen may be of the type disclosed in Rapoport U.S. Pat. No. 3,581,660 previously referenced and incorporated herein, or it may be of the type disclosed in Rapoport U.S. Pat. No. 4,011,085 previously referenced and incorporated herein. In either event, the second random pattern screen is derived from the first by moving the first screen, preferrably rotating the first screen by 90°, and then exposing the photographic image through the different, second random pattern screen derived thereby. For an enhanced tritone, an additional second screen may be derived by a further 90° rotation. The time interval of the exposures may be same, or can differ, based on the effect that is desired. Using such random pattern screens, a plurality of random pattern images may be produced, each suitable for making a random pattern halftone printing plate. In a further aspect of the method of this invention, each random pattern halftone image may be a positive or negative image of the original copy, but a photographic positive image, which produces positive working plates, is preferred. The use of positive working plates in the preferred embodiment of this invention reverses the conventional preference for negative working plates. A typical positive working plate is capable of holding more dots and generally has better resolution than does a typical negative working plate. While positive working plates are preferred, negative working plates may also be used. Finally, the difference in making an enhanced monochrome duotone and an enhanced monochrome tritone is in the number of plates. Enhanced monochrome duotones are made with a first random pattern halftone printing plate and one second random pattern plate. Enhanced monochrome tritones are made with a first random pattern plate and two second random pattern plates.

These steps may be accomplished electronically by scanning the photographic image of the original copy through an electronic scanner equipped with software to generate a random pattern halftone image. Such scanners are commercially available, and one example is the scanner sold under the trademark, SMART SCANNER, available from Scitex America Corporation, 8 Oak Park Drive, Bedford, Mass. 01730. Using such a scanner, a first scan produces a first random pattern image, and second and subsequent scans produce second random pattern images, each suitable for making a random pattern halftone printing plate (the random nature of the software generates a different random pattern on each scan).

Methods of making the photomechanical random pattern screens suitable for use in the improved method of this invention are disclosed in the Rapoport patents previously referenced and incorporated herein. The effects can also be electronically generated by scanners such as the one previously referenced.

By dispensing with the conventional grid halftone screens, the present invention results in a startling increase in transparency and contrast fidelty, and depth. By using photographic positive images rather than negative images, the present invention permits noticeably greater resolution and clarity relative to processes using photographic negatives.

A final step of the improved method of this invention is to combine the improved multi-step printing method described above with a waterless press means of performing the printing steps. Waterless press means are well known in the art, and a representative method is disclosed in U.S. Pat. No. 4,259,905 by Abiko et al. previously referenced and incorporated herein. The use of such waterless press means in combination with the improved multi-step printing method of this invention permits the use of random screens made at the upper limits disclosed by the Rapoport patents previously referenced, with as many as 250,000 or more irregularities per square inch of screen surface. This combination results in dramatic increases in matching the transparency and contrast of the reproduced copy to that of the original copy compared to results achieved with existing waterless press methods, with existing multi-step printing methods, or with the improved multi-step printing method of this invention when practiced without the waterless press means.

Example 1(b)

Enhanced duochrome printing (tritone)

The improved method of the present invention is realized in the following manipulative steps for enhancing the reproduction of duochrome continuous tone original copy:

1. producing continuous tone color separations of the original copy for each of the two colors desired for duochrome reproduction, 2. using the color separations to form a separate first random pattern halftone image of each color separation of the original copy by photomechanical or electronic means, 3. converting each of the first random pattern halftone images of the color separations of the original copy into first halftone random pattern printing plates by utilizing accepted and well known procedures in the lithographic art, 4. using the color separations to form a second random pattern halftone image of one of the color separations of the original copy by photomechanical or electronic means, 5. converting the second random pattern halftone image of the chosen color separation into a second halftone random pattern printing plate, and 6. printing a substrate with the first and second random pattern halftone printing plates in sequence and in registry to produce a single enhanced duochrome (tritone) reproduction of the original copy.

The steps of producing continuous tone color separations, of exposing them to a surface through a screen, or of electronically scanning them, and converting the halftone images into halftone printing plates are performed according to accepted and well known techniques in the lithographic art. The steps involved in using and making the random pattern screens, or their electronic equivalent, and a final step involving a waterless press are as described in Example 1(a) above. In making the enhanced duochrome (tritone), there are two first plates and one second plate. A paired first and second plate are printed with the same color to bring out higher tone densities, while the remaining first plate is printed with another color to add a different tone. Using the methods described in Example 1(a) above, no two random patterns used to generate any of the random pattern printing plates are the same.

Example 1(c)

Enhanced four color separation printing

The improved method of the present invention is realized in the following manipulative steps for enhancing the reproduction of multi-colored original copy:

1. producing continuous tone color separations of the original copy for each of the three primary process colors, cyan, magenta, yellow, and, preferably, black,
2. using the color separations to form a separate first random pattern halftone image of each color separation of the original copy by photomechanical or electronic means,
3. converting each of the first random pattern halftone images of the color separations of the original copy into first halftone random pattern printing plates by utilizing accepted and well known procedures in the lithographic art,
4. using the color separations to form at least one second random pattern halftone image of one or more of the color separations of the original copy by photomechanical or electronic means,
5. converting each second random pattern halftone image of the chosen color separation into a second halftone random pattern printing plate, and
6. printing a substrate with the first and second random pattern halftone printing plates in sequence and in registry to produce a single enhanced multi-color reproduction of the original copy.

The steps of producing continuous tone color separations, of exposing them to a surface through a random screen, or of electronically scanning them, and converting the halftone images into halftone printing plates are performed according to accepted and well known techniques in the lithographic art. The steps involved in using and making the random pattern screens, or their electronic equivalent, and a final step involving a waterless press are as described in Example 1(a) above. In making the enhanced four color separation halftone, there are four first plates for each of the process colors plus black, and at least one second plate, preferrably two second plates. A paired first and second plate may be printed with cyan, and the other paired first and second plates may be printed with magenta. Other combinations may be used, depending upon the desired effect. Using the methods described in Example 1(a) above, no two random patterns used to generate any of the random pattern printing plates are the same (where photomechanical techniques are used, the rotations may be at intervals other than 90° so as to generate different random patterns from a single screen).

Example 2(a)

Halftone printing

The improved method of the present invention is realized in the following manipulative steps for the reproduction of monochrome continuous tone original copy:

1. producing a photographic image of the original copy,
2. using the photographic image of the original copy to form a random pattern halftone image of the original copy by photomechanical or electronic means,
3. converting the random pattern halftone image of the original copy into a random pattern halftone printing plate by utilizing accepted and well known procedures in the lithographic art,
4. printing a substrate with the random pattern halftone printing plate to produce a monochrome reproduction of the original copy.

The steps of producing a photographic image of the original copy, of exposing it to a surface through a screen, or of electronically scanning it, and converting the halftone image into a halftone printing plate are performed according to accepted and well known techniques in the lithographic art. The steps involved in using and making the random pattern screen, or its electronic equivalent, and a final step involving a waterless press are as described in Example 1(a) above. Because there is no need, in this example, to use more than one screen, there is no need to combine more than one random pattern printing plates as in Example 1(a), and any of the random patterns there described can be used.

Example 2(b)

Duochrome (duotone) and trichrome (tritone) printing

The improved method of the present invention is realized in the following manipulative steps for reproducing duochrome (duotone) and trichrome (tritone) continuous tone original copy:

1. producing continuous tone color separations of the original copy for each of the two or three colors desired for duochrome or trichrome reproduction,
2. using the color separations to form a separate random pattern halftone image of each color separation of the original copy by photomechanical or electronic means,
3. converting each of the halftone images into halftone random pattern printing plates by utilizing accepted and well known procedures in the lithographic art,
4. printing a substrate with the random pattern halftone printing plates in sequence and in registry to produce a single reproduction of the original copy.

The steps of producing continous tone color separations, of exposing them to a surface through a screen, or of electronically scanning them, and converting the halftone images into halftone printing plates are performed according to accepted and well known techniques in the lithographic art. The steps involved in using and making the random pattern screens, or their electronic equivalent, and a final step involving a waterless press are as described in Example 1(a) above. In making a duochrome, two plates are used. In making a trichrome, three plates are used. Using the methods described in Example 1(a) above, no two random patterns used to generate any of the random pattern printing plates are the same.

Example 2(c)

Basic four color halftone printing

The improved method of the present invention is realized in the following manipulative steps for reproducing multi-colored continuous tone original copy:

1. producing continuous tone color separations of the original copy for each of the three primary process colors cyan, magenta, yellow, and, preferably, black,
2. using the color separations to form a separate random pattern halftone image of each color separation of the original copy by photomechanical or electronic means,
3. converting each of the halftone images into halftone random pattern printing plates by utilizing accepted and well known procedures in the lithographic art, 4. printing a substrate with the random pattern halftone printing plates in sequence and in registry to produce a single reproduction of the original copy.

The steps of producing continuous tone color separations, of exposing them to a surface through a screen, or of electronically scanning them, and converting the halftone images into halftone printing plates are performed according to accepted and well known techniques in the lithographic art. The steps involved in using and making the random pattern screens, or their electronic equivalent, and a final step involving a waterless press are as described in Example 1(a) above. In making the basic four color separation halftone, there are four plates, one for each of the process colors plus black. Using the methods described in Example 1(a) above, no two random patterns used to generate any of the random pattern printing plates are the same.

I claim:

1. A method for reproducing a copy onto a substrate, comprising forming a random pattern image of said copy and converting said image into a corresponding random pattern plate; and printing said substrate with said random pattern plate using a waterless press, to produce a finished reproduction without printing the substrate with any plate having a pattern that is not random.

2. The method of claim 1, wherein only one color is printed onto said substrate.

3. The method of claim 1, wherein said random pattern image is converted into a plurality of random pattern printing plates, one random pattern printing plate for each of a plurality of colors, and each random pattern printing plate is used successively to print a separate color onto said substrate using a waterless press to produce a finished reproduction without printing the substrate with any plate having a pattern that is not random.

4. A method for reproducing a copy onto a substrate, comprising forming a plurality of different random pattern images of said copy and converting said plurality of random pattern images into a plurality of corresponding random pattern plates; and printing said substrate with said plurality of corresponding random pattern plates using a waterless press to produce a finished reproduction without printing the substrate with any plate having a pattern that is not random.

5. A method of claim 4, wherein a plurality of colors are printed successively onto the substrate with said plurality of random pattern plates, one color to each plate.

6. The method of claim 5, wherein more than one color is printed using a given random pattern image by converting said random pattern image into a plurality of random pattern plates, one random pattern plate for each of a plurality of colors, and each random pattern plate is used to print a separate color onto said substrate using a waterless press to produce a finished reproduction without printing the substrate with any plate having a pattern that is not random.

7. The method of claim 5, wherein a plurality of random images are used to print a given color.

8. A method for reproducing a copy onto a substrate, comprising forming at least one random pattern images of said copy and converting the random pattern images into a set of corresponding random pattern plates; and printing said substrate with the set of random pattern plates to produce a finished reproduction without printing the substrate with any plate having a pattern that is not random.

9. The method of claim 8, wherein said at least one random pattern images is only one random pattern image.

10. The method of claim 9, wherein said set of at least one random pattern images is a plurality of random pattern images.

* * * * *

REEXAMINATION CERTIFICATE (2874th)

United States Patent [19]

Stein

[11] B1 5,283,154

[45] Certificate Issued May 7, 1996

[54] RANDOM SCREEN WATERLESS PRINTING PROCESS

[75] Inventor: Richard E. Stein, Denver, Colo.

[73] Assignee: National Printing and Packaging Company, Denver, Colo.

Reexamination Requests:
No. 90/003,540, Aug. 18, 1994
No. 90/003,814, May 2, 1995

Reexamination Certificate for:
Patent No.: 5,283,154
Issued: Feb. 1, 1994
Appl. No.: 861,226
Filed: Apr. 1, 1992

Related U.S. Application Data

[63] Continuation-in-part of Ser. No. 602,676, Oct. 24, 1990, abandoned.

[51] Int. Cl.⁶ ........................................................ G03F 7/02
[52] U.S. Cl. ...................... 430/301; 430/303; 101/450.1; 101/456; 101/467; 101/469
[58] Field of Search ................................... 430/301, 303; 101/456, 467, 450.1, 469

[56] References Cited

U.S. PATENT DOCUMENTS

| | | |
|---|---|---|
| 809,157 | 1/1906 | Weyl . |
| 3,130,669 | 4/1964 | Cooke . |
| 3,511,178 | 5/1970 | Curtin et al. . |
| 3,961,955 | 6/1976 | Gracia et al. ................... 137/624.15 |
| 4,259,905 | 4/1981 | Abiko et al. ........................ 101/467 |
| 4,456,924 | 6/1984 | Rosenfeld . |
| 4,920,501 | 4/1990 | Sullivan et al. . |
| 5,150,429 | 9/1992 | Miller et al. . |

OTHER PUBLICATIONS

Brochure, "Toray Waterless Plate," published Jun. 1988, Japan.

Brochure, "Toray Waterless Plate-N," published Dec. 1983, Japan.

J. C. Stoffel et al., *A Survey of Electronic Techniques for Pictorial Image Reproduction*, IEEE Transactions on Communications, vol. COM-29, pp. 1898-1925 Dec. 1981).

*Primary Examiner*—James J. Seidleck

[57] ABSTRACT

An improved method of making lithographic reproductions is disclosed. The method involves several improvements over prior processes, including (a) the combination of random plates and a waterless, dry press for halftone, duotone, tritone and four color separation halftone printing, and (b) the use, in duotone, tritone and four color separation halftone printing of random plates exclusively for all the plates involved in the multi-step printing process.

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 8–10 are cancelled.

Claims 1 and 4 are determined to be patentable as amended.

Claims 2–3 and 5–7, dependent on an amended claim, are determined to be patentable.

1. A method for reproducing a copy onto a substrate, comprising forming a random pattern image of said copy [and]; *converting said image into a corresponding random pattern plate; and printing said substrate with said random pattern plate using a waterless press, to produce a finished reproduction without printing the substrate with any plate having a pattern that is not random.*

4. A method for reproducing a copy onto a substrate comprising forming a plurality of different random pattern images of said copy [and]; *converting said plurality of random pattern images into a plurality of corresponding random pattern plates; and printing said substrate with said plurality of corresponding random pattern plates using a waterless press to produce a finished reproduction without printing the substrate with any plate having a pattern that is not random.*

* * * * *